United States Patent [19]

Somerset

[11] Patent Number: 5,695,347

[45] Date of Patent: Dec. 9, 1997

[54] CONNECTION ASSEMBLY FOR ELECTRONIC DEVICES

[75] Inventor: David G. Somerset, Salem, Mass.

[73] Assignee: Seiko Epson Corporation, Tokyo, Japan

[21] Appl. No.: 479,345

[22] Filed: Jun. 7, 1995

[51] Int. Cl.⁶ .................................................. H01R 9/07
[52] U.S. Cl. ............................................. 439/67; 439/371
[58] Field of Search ................................ 439/67, 68, 77, 439/371, 289, 493

[56] References Cited

U.S. PATENT DOCUMENTS

| 2,543,740 | 2/1951 | Ridgely, Jr. et al. | 439/371 |
| 3,214,713 | 10/1965 | Strobel | 439/466 |
| 4,186,983 | 2/1980 | Kaye | 439/289 |
| 4,463,999 | 8/1984 | Knickerbocker | 439/371 |
| 4,702,540 | 10/1987 | Siemon | 439/371 |
| 4,825,876 | 5/1989 | Beard | 439/930 |
| 5,057,023 | 10/1991 | Kabadi et al. | 439/67 |
| 5,315,489 | 5/1994 | McCall et al. | 361/801 |

FOREIGN PATENT DOCUMENTS

| 0 106 137 | 4/1984 | European Pat. Off. |
| 2 135 529 A | 8/1984 | European Pat. Off. |

Primary Examiner—Neil Abrams
Attorney, Agent, or Firm—W. Glen Johnson

[57] ABSTRACT

A boardless connection assembly establishes flying connections to an electronic device such as an IC module by means of flexible circuits terminated by connectors clamped to the perimeter of the device so that the electrical contacts of the connectors engage the contacts of the electronic device. All of the connectors of the assembly may be clamped to the device by a band ring which surrounds the electronic device and includes a closure member to press the connectors against the electronic device with sufficient force to maintain reliable electrical connections between the contacts of the connector and those of the device.

7 Claims, 2 Drawing Sheets

CONNECTION ASSEMBLY FOR ELECTRONIC DEVICES

This invention relates to a connection assembly for electronic devices. It relates especially to an assembly of this type for connecting electronic devices such as integrated circuit (IC) modules to other similar modules or to printed circuit boards in a computer or other electrical apparatus.

BACKGROUND OF THE INVENTION

An integrated circuit module comprises an integrated circuit chip that has been encapsulated in a protective material such as ceramic. In many cases, the module has electrical contacts or pads at its perimeter for sending signals to and receiving signals from the chip in the module. Typically, such modules have been connected to a printed circuit board by inserting the modules into socket-type connectors mounted to the circuit board. Electrical conductors are provided in the connectors which establish electrical connections between the printed circuit board and the contacts on the IC module. In this way, electrical signals may be exchanged between the modules and other electronic devices and components mounted to the printed circuit board.

The printed circuit board may then be connected to other printed circuit boards comprising the particular electronic apparatus by flexible circuits or harnesses or by inserting the boards on edge into socket-like connectors mounted to a motherboard whose printed circuit paths allow the exchange of signals between the various printed circuit boards.

As may be appreciated, all the printed circuit boards used to interconnect the various electrical devices and modules take up an appreciable amount of space and thus increase the overall size and weight of the electrical apparatus.

Accordingly, it would be desirable if there existed a means for interconnecting electrical devices and modules which does not require the mounting of the devices or modules to a printed circuit board or other fixed base.

SUMMARY OF THE INVENTION

Accordingly, it is an object of the present invention to provide a connection assembly for an electronic device which does not include a printed circuit board or other fixed base.

Another object of the invention is to provide such a boardless connection assembly which maintains reliable electrical connections with the electronic device even when the device is subjected to vibration and shock forces.

Still another object of the invention is to provide a connection assembly for an electronic device which is relatively lightweight and which occupies a minimum amount of space.

A further object of the invention is to provide such an assembly which can be connected to and disconnected from an electronic device relatively easily.

Yet another object of the invention is to provide an assembly of this type which is relatively easy and inexpensive to manufacture.

Other objects will, in part, be obvious and will, in part, appear hereinafter. The invention accordingly comprises the features of construction, combination of elements and arrangement of parts which will be exemplified in the following detailed description, and the scope of the invention will be indicated in the claims.

Briefly, my connection assembly is a boardless arrangement which establishes flying connections to an electronic device by means of flexible printed circuits terminated by connectors which are clamped to the perimeter of the electronic device so that the electrical contacts of the connectors engage the contacts or pads of the electronic device. In accordance with the invention, all of the connectors of the assembly may be clamped to that device by a band ring which surrounds the electronic device and includes means for compressing or closing the band ring to press the various connectors against the electronic device with sufficient force to maintain reliable electrical connections between the contacts of the connectors and those of the device.

Thus, the electronic device may be supported by the flexible circuits leading to it and the clamping action of the band ring holds the contacts of the connectors in intimate electrical contact with those of the electronic device through the force exerted by clamping pressure. In this way, the "floating" electronic device and its connections to the outside world are isolated from and substantially unaffected by external vibration and shock forces. No longer do the connectors for the electrical device require connections to a circuit board or other fixed base in order to maintain contact stability.

As will be seen, the contact assembly is composed of relatively few pads which are easy to make and to assemble. Furthermore, the connection assembly can be connected to and disconnected from a compatible electronic device quite easily and without requiring any tools. Therefore, the assembly should find wide application in computers and other electrical apparatus requiring the interconnection of myriad electrical devices and modules.

BRIEF DESCRIPTION OF THE DRAWINGS

For a fuller understanding of the nature and objects of the invention, reference should be had to the following detailed description taken in connection with the accompanying drawings, in which.

DESCRIPTION OF THE PREFERRED EMBODIMENTS

Figure 1:
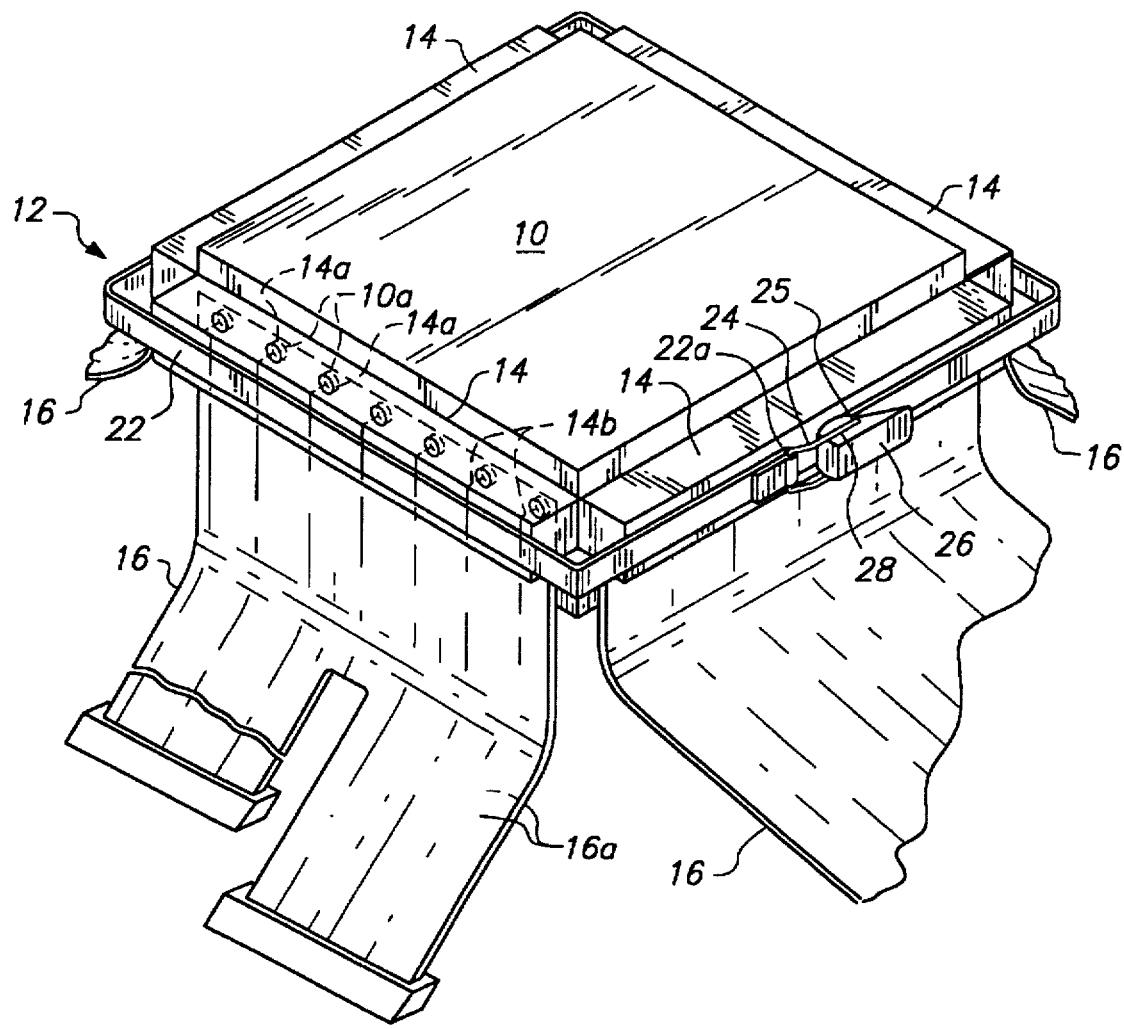
FIG. 1 is a perspective view, with pads broken away, showing my connection assembly connected to an electronic device.

Refer now to FIG. 1 which illustrates an electronic device 10 in the form of a flat, generally rectangular body having a four-sided perimeter. The illustrated device is an IC module or package; however, it could just as well be some other kind of electronic device commonly used in computers or other electronic installations. Suffice it to say that device 10 is of the type that includes electrical contacts or pads 10a at the perimeter of the device by which signals may be sent to and received from the internal IC chip comprising device 10.

In the illustrated device, only a few of the contacts 10a are shown. In actuality, a particular device 10 may have well over a hundred such contacts distributed around its perimeter.

Surrounding device 10 is a connection assembly shown generally at 12. Assembly 12 includes one or more connectors 14, each connector removably engaging a side of the device. In FIG. 1 there are four such connectors 14, one at each side of device 10. Each connector 14 has a row of contacts 14a which are arranged to engage or mate with the contacts 10a at the corresponding side of device 10.

Extending from the underside of each connector 14 is a strap-like flexible printed circuit 16 having electrical conductors or paths 16a extending along its length. The ends of conductors 16a inside each connector 14 are connected to the conductors 14a of that connector by internal electrical connections 14b.

The opposite ends of the printed circuit 16 may lead to one or more connectors 18. These connectors 18 may be standard connectors such as those for engaging the contacts at the edge of a printed circuit board or they may be the connectors of other connection assemblies similar to assembly 12 described herein.

In FIG. 1, the left hand printed circuit 16 is shown as being bifurcated so that the circuit extends to two separate connectors 18. In some applications, a particular flexible circuit 16 may be divided several times along its length so that the signals on the printed circuit conductors 16a can be routed to and from several connectors 18 connected to several different cards, modules or other devices comprising the particular electronic apparatus.

The connection assembly 12 also includes a band ring 22 which engages around all of the connectors 14 at the perimeter of device 10 so that the band ring surrounds that device. Preferably, band ring 22 is of a strong, durable, flexible, inextensible material such as nylon, spring steel or stainless steel. The band ring 22 may be secured to the outside surfaces of connectors 14 by suitable means such as fasteners or an adhesive (not shown). Alternatively, the band ring may simply interfit or frictionally engage the connectors; see FIG. 3.

In any event, the band ring 22 includes means for compressing or closing the band ring so that the band ring forceably presses each connector 14 against the corresponding side of device 10 thereby bringing the connector contacts 14a into intimate electrical engagement with the corresponding contacts 10a of the electrical device 10.

In the illustrated embodiment of the invention, the band ring 22 is split and a link 24 extends between the ends of the band ring. One end of the link 24 pivots in an eye 22a formed at one end of the band ring. The other end of the link 24 is connected at a pivot point 25 to a lever arm 26 rotatably mounted at 28 to the other end of the band ring. The connection of the link 24 to the lever arm 26 is such that when the lever arm is in a raised position wherein it extends out away from the band ring 22, the ring is open or enlarged. In this condition, the connectors are spaced slightly from the sides of device 10. On the other hand, when the lever arm is in its clamping position lying parallel to the band ring, the link 24 draws the opposite ends of the band ring together, thereby compressing or closing the band ring so that the ring exerts a clamping force on the connectors 14. When the lever 26 is in its clamping position, the pivot point 25 lies inboard pivot 28, i.e., overcenter, so that the lever tends to remain in that position. The lever 26 operates in more or less the same way as the one described in U.S. Pat. No. 2,543,742, the contents of which are hereby incorporated by reference herein.

Also, in lieu of lever 26, other means may be provided for closing the band ring 22. For example, a threaded fastener rotatably connected to one end of the band ring may be threaded into a nut affixed to the other end of the band ring.

Figure 2:
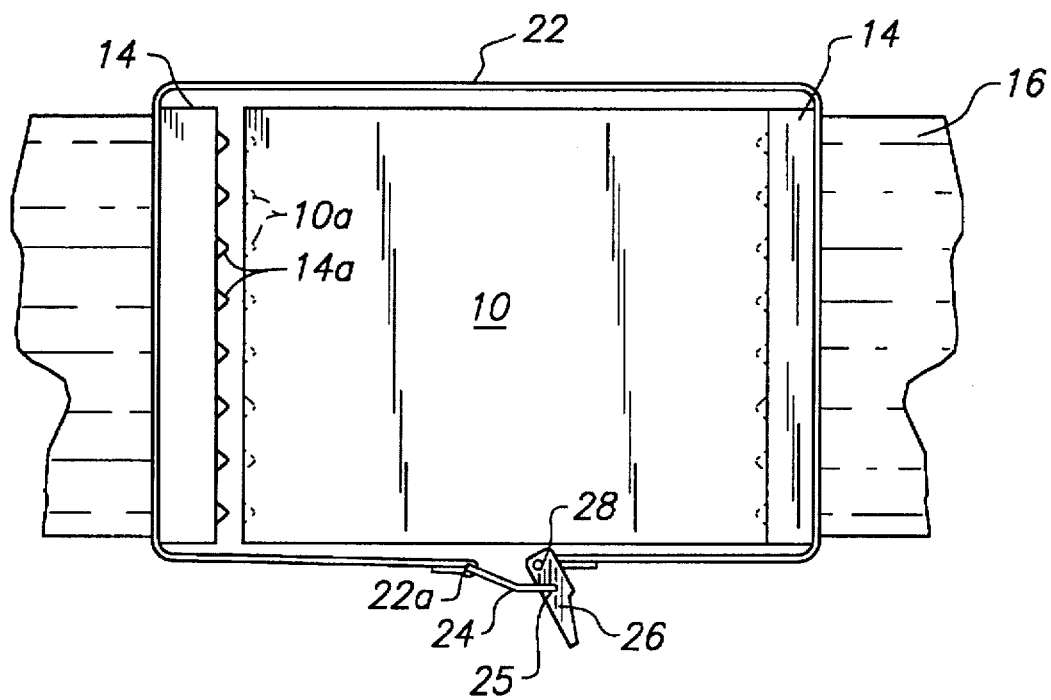
FIG. 2 is a plan view on a smaller scale showing a connection assembly similar to the one depicted in FIG. 1 partially connected to an electronic device.

Turn now to FIG. 2 which shows the connections 10a and 14a of device 10 and connector 14, respectively. The FIG. 2 assembly is similar to one in FIG. 1 except that there are only two connectors 14 at opposite sides of device 10. Also, the band ring 22 is shown in its open condition so that one of the connectors 14 is spaced somewhat from the corresponding side of device 10. As seen in FIG. 2, the contacts 10a are conical female contacts, and the contacts 14a are conical male contacts so that when the connector 14 is clamped against the side of device 10, the contacts 10a, 14a are self aligning.

Figure 3:
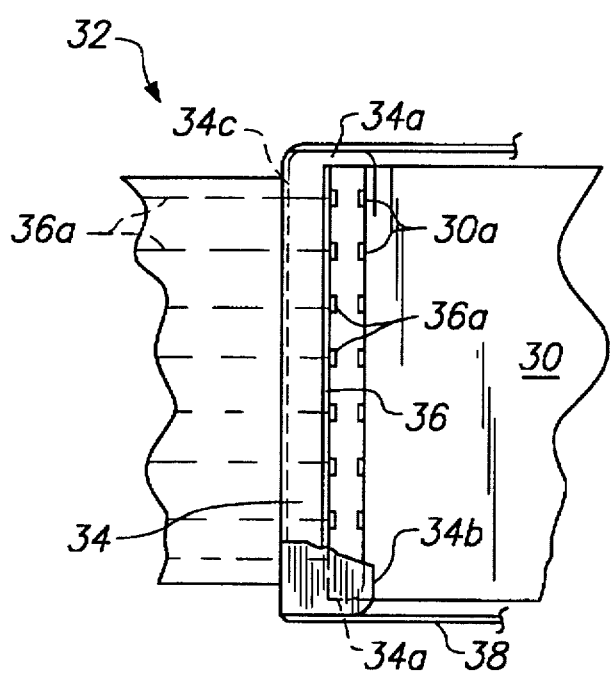
FIG. 3 is an exploded plan view showing another embodiment of the connection assembly.

Referring now to FIG. 3, the electrical device 30 depicted there has planar contacts or pads 30a at the perimeter of the device. Accordingly, a connection assembly 32 is provided which has connector(s) 34 each arranged to support one end of a flexible printed circuit 36 such that the circuit's conductors 36a are disposed opposite device 30. Thus, in this embodiment, the electrical conductors 36a of the printed circuit 36 also constitute the connector's electrical contacts. In other words, those conductors 36a are arranged on the printed circuit so that their ends lie directly opposite contacts 30a of device 30 when the connector 34 is placed against the side of device 30.

To properly position the connector relative to device 30, the connector may include extensions 34a at its opposite ends to establish the lateral or horizontal position of the connector relative to device 30. Similar extensions 34b may be provided along the connector to fix the vertical position of the connector relative to the device.

The extensions 34a, 34b, not only help to register the connector contacts 36a with the device's contacts 30a, they also form a barrier or seal at the boundary between device 30 and the connection assembly 32 to shield the contacts from dirt and moisture.

The connection assembly 32 also includes a band ring 38 similar to the band ring 22 described above in connection with FIGS. 1 and 2. In this case, however, the band ring seats in a longitudinal groove 34c formed in the outside surface of connector 34. Preferably, there is tight or interference fit between the band ring and the walls of the groove 34c which suffices to anchor the connector to the band ring.

In order to connect the connection assembly 12 or 32 to an electronic device, the lever 26 is moved to its raised position which effectively opens or enlarges the band ring 22. This allows the device 10 or 30 to be positioned within the operative connection assembly such that the contacts of the electronic device are disposed opposite those of the connection assembly. Then, the lever 26 may be moved to its closed or clamping position which closes or compresses the band ring 22 thereby applying compressive forces to the connectors. Resultantly, the connectors are pressed tightly against the corresponding sides of the electrical device thereby establishing intimate electrical connections between the contacts of the assembly and those of the device.

The device 10 or 30 may be disengaged from its connection assembly simply by moving lever 26 to its open position and sliding the device out of the assembly.

In some applications, the connection assembly may also perform a grounding function. For example, one of the connector contacts may be grounded through its flexible circuit. That contact may engage a grounding contact of the electronic device. In another application, a conductive band ring may be arranged to engage a grounding contact at the back of a connector and carry the ground to the electronic device or to another connector of the assembly. Still other possible grounding schemes may be envisioned from the present disclosure.

It will thus be seen that the objects set forth above, among those made apparent from the preceding description, are efficiently attained. Also, certain changes may be made in the above constructions without departing from the scope of the invention. For example, the connectors 14, 34 may be taller and carry a plurality of parallel rows of contacts connected to a corresponding plurality of flexible circuits thereby enabling the connectors to butt against a plurality of electronic devices arranged in a stack, the connectors being pressed against the devices by one or more band rings. Therefore, it is intended that all matter contained in the above description or shown in the accompanying drawings shall be interpreted as illustrative and not in a limiting sense.

It shall also be understood that the following claims are intended to cover all of the generic and specific features of the invention described herein.

What is claimed is:

1. A connection assembly for an electronic device comprising
   a generally rectangular electronic device, said device having electrical contacts exposed at opposite sides of the device;
   a pair of connectors, each connector having a generally planar surface and an array of electrical contacts positioned at said surface such that when said connectors are selectively positioned against said opposite sides of the electronic device, the connector contacts engage corresponding contacts of the electronic device;
   a flying flexible circuit extending from each connector in a manner substantially normal to the associated connector surface, each said circuit including conductors connected electrically to the contacts of the associated connector;
   a generally rectangular band ring, said band ring being similar in shape to, but encompassing a larger area than, said electronic device;
   means for mounting said connectors to opposite sides of the band ring so that said connector surfaces face each other, and
   means for closing said band ring so that when the band ring is positioned around the electronic device with the connectors selectively positioned against said opposite sides of the electronic device, the area encompassed by the band ring is reduced sufficiently to clamp the connectors to said opposite sides of the electronic device with sufficient force to establish intimate electrical connections between the contacts of the connectors and the corresponding contacts of the electronic device without restricting said flexible circuits.

2. A connection assembly for an electronic device having a perimeter and an array of electrical contacts positioned along the perimeter, said assembly comprising:
   a plurality of connectors for butting against the perimeter of the electronic device, each said connector comprising:
      an elongated body defining respective major and minor axes;
      an array of electrical contacts disposed within said body to releasably engage a portion of the electronic device contacts; and
      a flexible circuit in electrical communication with said connector contacts and extending from said body substantially perpendicular to the major axis;
   annular damping means engaging each said connector body in a manner substantially parallel to its major axis and for circumscribing the electronic device; and
   means for collapsing the clamping means so that when said connectors are butted against the electronic device, said clamping means presses said connector bodies against the electronic device with sufficient force to establish intimate electrical engagement of said connector contacts with corresponding contacts of the electronic device.

3. The connection assembly defined in claim 2 wherein the clamping means comprises:
   a flexible inextensible band in the form of a split ring having opposing ends, and
   means for adjusting the spacing of said band ends.

4. The connection assembly defined in claim 2 wherein the adjusting means includes
   a link having one end attached to one end of the band;
   a lever arm pivotally connected to the other end of the band, and
   means for pivotally connecting the other end of the link to said lever arm at a location thereon spaced from the pivotal connection of the lever arm to the other end of the band.

5. The connection assembly defined in claim 2 and further including an electronic device positioned within, and surrounded by, said annular clamping means so that when the clamping means is collapsed by the collapsing means, said connector bodies and said electronic device are clamped together.

6. The connection assembly defined in claim 5 wherein the corresponding contacts of said electronic device and of said connectors are shaped so that when pressed together, they self align.

7. The connection assembly defined in claim 5 wherein said electronic device is a generally rectangular module.

* * * * *